(12) United States Patent
Taddiken et al.

(10) Patent No.: US 12,274,076 B2
(45) Date of Patent: Apr. 8, 2025

(54) INTEGRATED CIRCUIT, METHOD FOR MANUFACTURING AN INTEGRATED CIRCUIT, WAFER AND METHOD FOR MANUFACTURING A WAFER

(71) Applicant: Infineon Technologies AG, Neubiberg (DE)

(72) Inventors: Hans Taddiken, Munich (DE); Christoph Glacer, Munich (DE); Dominik Heiss, Munich (DE); Christoph Kadow, Gauting (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/379,423

(22) Filed: Oct. 12, 2023

(65) Prior Publication Data

US 2024/0040803 A1 Feb. 1, 2024

Related U.S. Application Data

(63) Continuation of application No. 17/192,979, filed on Mar. 5, 2021, now Pat. No. 11,818,900.

(30) Foreign Application Priority Data

Mar. 5, 2020 (EP) ..................... 20161123

(51) Int. Cl.
*H10B 63/00* (2023.01)
*H10N 70/00* (2023.01)
*H10N 70/20* (2023.01)

(52) U.S. Cl.
CPC ........... *H10B 63/30* (2023.02); *H10N 70/021* (2023.02); *H10N 70/231* (2023.02); *H10N 70/826* (2023.02)

(58) Field of Classification Search
CPC ................................ H10B 63/00; H10N 70/00
See application file for complete search history.

(56) References Cited

U.S. PATENT DOCUMENTS

| | | | |
|---|---|---|---|
| 9,917,104 | B1 | 3/2018 | Roizin et al. |
| 2008/0186760 | A1 | 8/2008 | Elmegreen et al. |
| 2008/0210923 | A1 | 9/2008 | Sato |
| 2009/0184309 | A1 | 7/2009 | Mathew et al. |
| 2009/0233421 | A1 | 9/2009 | Lee et al. |
| 2013/0242649 | A1 | 9/2013 | Pirovano |
| 2019/0214434 | A1 | 7/2019 | Boivin et al. |

*Primary Examiner* — Marvin Payen
(74) *Attorney, Agent, or Firm* — Murphy, Bilak & Homiller, PLLC

(57) ABSTRACT

An integrated circuit includes a transistor, a first metallization layer above the transistor and electrically connected to the transistor, and a phase change switch, wherein at least a part of the phase change switch is provided below the first metallization layer, wherein the first metallization layer is provided laterally adjacent to the phase change switch, wherein the phase change switch comprises a heater, and wherein the heater and a part of the transistor are each provided in a lower-level interconnect layer of the integrated circuit.

10 Claims, 17 Drawing Sheets

INTEGRATED CIRCUIT, METHOD FOR MANUFACTURING AN INTEGRATED CIRCUIT, WAFER AND METHOD FOR MANUFACTURING A WAFER

TECHNICAL FIELD

The present disclosure relates to an integrated circuit, a method for manufacturing an integrated circuit, a wafer for manufacturing an integrated circuit and a method for manufacturing a wafer.

BACKGROUND

The technical requirements for high frequency RF-applications, such as radar sensing and mobile communication according to the 5G standard, are increasing. In particular, switches with improved characteristics compared to state of the art CMOS switches will be required to meet future demands. Phase change switches are considered as promising candidates for switching RF-signals. Typically, dedicated technologies are used to manufacture stand-alone discrete phase change switches which may need to be connected on a board or package level to logic devices having been manufactured with a different process technology. The resulting increased number of interconnections and length of the interconnections may lead to a degradation of key performance parameters. Additionally, co-packing adds manufacturing complexity and cost.

Hence, there may be a need for an integrated circuit with improved performance parameters, a method for manufacturing such an integrated circuit, a wafer for manufacturing such an integrated circuit and a method for manufacturing such a wafer.

SUMMARY

It is proposed an integrated circuit comprising a transistor, a first metallization layer above the transistor electrically connected to the transistor, a phase change switch, in particular a phase change RF-switch, wherein the first metallization layer is provided laterally adjacent to the phase change switch, and wherein at least a part of the phase change switch is provided below the first metallization layer.

In addition, it is proposed a method for manufacturing an integrated circuit, wherein the integrated circuit comprises a phase change switch comprising a phase change material, a transistor, in particular a CMOS, bipolar or GaN transistor, and a first metallization layer above the transistor electrically connected to the transistor. The method comprises providing a wafer, wherein the wafer comprises the transistor and the first metallization layer, etching a trench in the wafer, wherein the trench is etched deeper than the first metallization layer, and depositing the phase change material in the trench to form a phase change material layer.

Furthermore, it is proposed a wafer, wherein the wafer comprises a transistor and a heater.

Moreover, it is proposed a method for manufacturing a wafer, wherein the wafer comprises a transistor and a heater, and wherein a part of the heater and a part of the transistor are manufactured in a same process step.

DETAILED DESCRIPTION

Phase change materials typically exhibit a higher electric conductivity in a crystalline phase state than in the amorphous phase state. Phase change switches allow for changing the phase state of the phase change material.

"Set" or "Setting" may refer to changing the phase state from amorphous to crystalline and rendering the phase change switch conductive. "Reset" or "Resetting" may refer to changing the phase state from crystalline to amorphous and rendering the phase change switch blocking.

Figure 1:
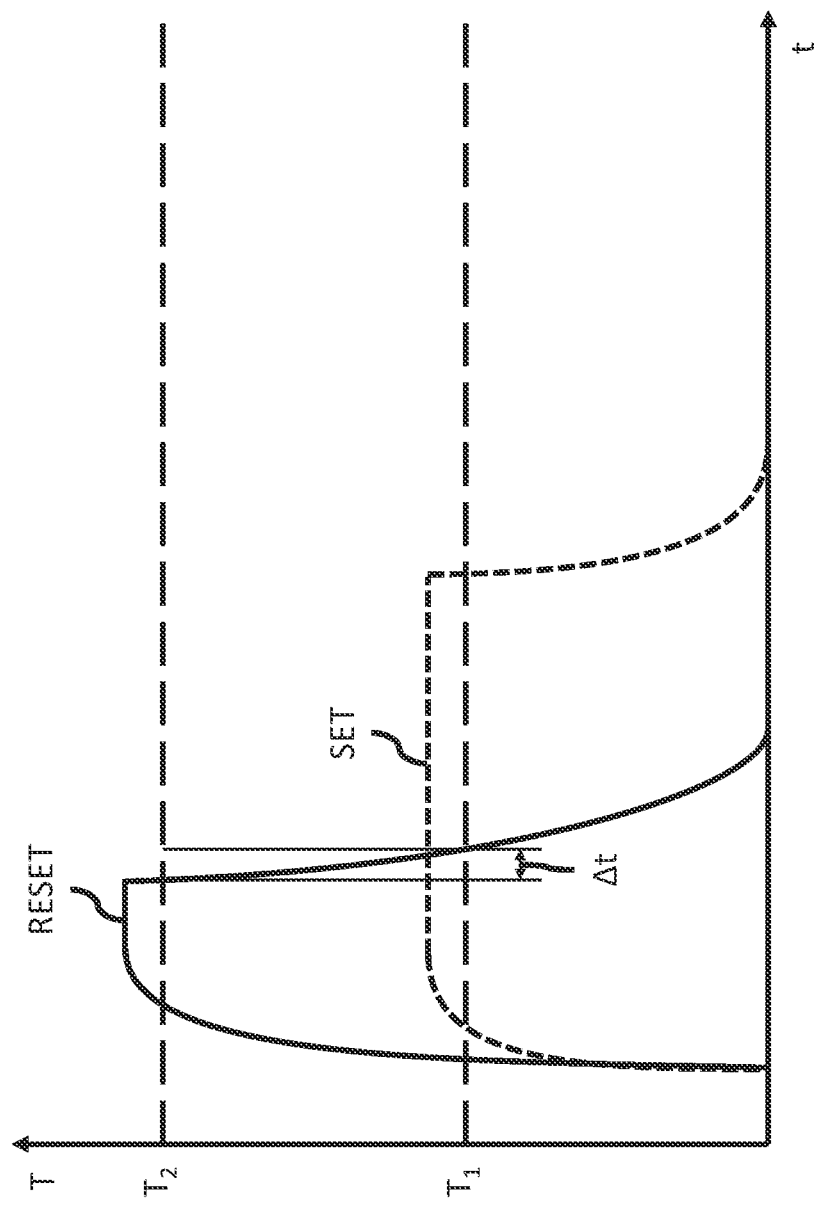
FIG. 1 illustrates setting and resetting a phase change switch.

FIG. 1 shows two exemplary temperature curves T over time t which may be used for setting ("SET") or resetting ("RESET") a phase change switch.

For setting the phase change switch (dashed line, "SET") the temperature of the phase change material of the phase change switch is raised above a first temperature $T_1$ but kept below a second temperature $T_2$, wherein $T_2$ is higher than $T_1$, for a sufficient time to allow for recrystallization of the phase change material. The phase change material remains in the crystalline phase state if the temperature when the temperature drops below $T_1$ again, for example, if the temperature drops to approximately ambient temperature. The temperature may drop because a heater is no longer active, for example.

For resetting the phase change switch (solid line, "RESET") the temperature of the phase change material of the phase change switch is raised above a second temperature $T_2$, which renders the phase change material liquid. Rapid cooling, which may also be called quenching, of the phase change material from the liquid phase to a temperature below $T_1$ leads to an amorphous state of the phase change material. In particular, the time $\Delta t$ the temperature of the phase change material is between $T_1$ and $T_2$ has to be kept short enough to avoid recrystallization of the phase change material.

Figure 2:
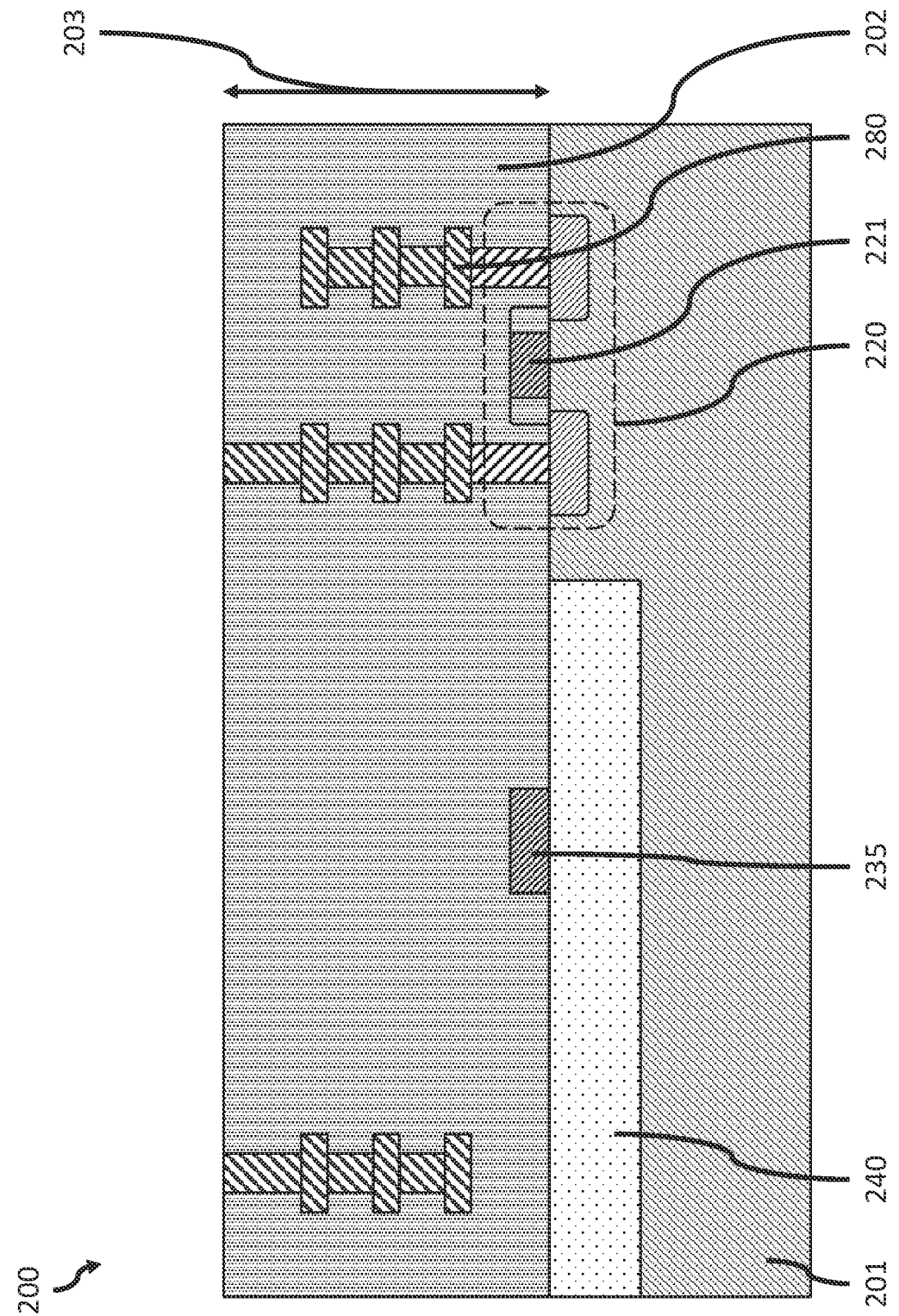
FIG. 2 shows a wafer for manufacturing an integrated circuit.

FIG. 2 shows a wafer 200. The wafer 200 comprises a substrate 201, a semiconductor device 220 and at least a first metallization layer 280. The wafer 200 may be called semi-finished wafer. The term "semi-finished wafer" may refer to a wafer for which all process steps for manufacturing the at least one semiconductor device 220, in particular, the process steps for forming the active zones of the semiconductor device 220, have been performed and the at least first metallization layer 280 has been provided.

In particular, the term "semi-finished wafer" may refer to a wafer 200 which may be taken from a process line of a first fab and introduced in another process line, for example, a process line of a different fab. The semi-finished wafer 200 may have been manufactured using a CMOS, BICMOS, bipolar or gallium nitrate (GaN) technology. Accordingly, the semi-finished wafer 200 may have been processed in a process line adapted to the respective technology. Afterwards, the semi-finished wafer may be processed in a process line adapted to a different technology as will be explained further below.

In the embodiment shown in FIG. 2, the semiconductor device 220 is a transistor, more specifically a CMOS transistor comprising a gate 221. However, in a more general way the advantageous of the proposed methods, integrated circuits and wafers also apply for other semiconductor device, e.g., diodes, photodiodes, light emitting diodes. A dielectric 202 covers the transistor 220 and the first metallization layer 280.

Optionally, the semi-finished wafer 200 may comprise an insulation area 240, in particular, a shallow trench insulation (STI) area.

As a further optional feature, the semi-finished wafer 200 may comprise a heater 235 above the insulation area 240. The transistor 220 may be part of control circuitry for operating the heater 235. The first metallization layer 280 may be provided laterally adjacent to the heater 235. The heater 235 may be provided below the first metallization layer 280. A part of the heater 235 and a part of the transistor 220 may be made of the same material. In addition, the part of the heater 235 and the part of the transistor 220 may be provided in a same layer of the semi-finished wafer 200.

For example, the part of the heater comprises at least one of polysilicon, tungsten, and silicide (in particular, tungsten silicide and/or cobalt silicide and/or titanium silicide), a nitrite (in particular, titanium nitride, tantalum nitrite).

In the example shown in FIG. 2, the part of the heater 235 is made of the same material as the gate 221 of the transistor 220. This material may be polysilicon with or without silicide. Polysilicon with or without may have the advantage that the resistivity thereof may be adapted by doping. Thus, the amount of heat generated by the heater 235 may be influenced not only by the dimensions of the heater 235 but also by adjusting the resistivity of the heater. Polysilicon with different predetermined doping levels may already be available in the process line for manufacturing the semiconductor device 220. Furthermore, it may be possible to influence the doping level of the heater 235 after the deposition of the polysilicon material, i.e. by diffusion or ion implantation.

In alternative embodiments, the part of the heater 235 may be formed of the same material as a part of a source or drain diffusion region of a CMOS transistor. Said diffusion region may or may not comprise a silicide.

Although not shown in FIG. 2, the heater 235 may already be in conductive connection with the transistor 220. The height 203 of the layers above the substrate 201 may be typically below 20 µm, such as below 15 µm, particularly below 10 µm.

A semi-finished wafer described herein before may be used for manufacturing an integrated circuit comprising a semiconductor device and a phase change switch, in particular, a phase change RF switch. The semiconductor device may be a transistor. The term "RF switch" may refer to a switch adapted for switching a signal line transmitting radio frequency signals. Radio frequency signals may be transmitted in a frequency range from around 20 kHz to around 300 GHz. The phase change RF switches described further below may in particular be adapted for frequencies in the ultrahigh frequency (UHF) (300 MHz to 3 GHz) and super high frequency (SHF) band (3 to 30 GHz) and extremely high frequency (EHF) bands (3 to 300 GHz). Accordingly, said phase change RF switches may be particularly useful for integrated circuits used in 5G applications.

Figure 3:
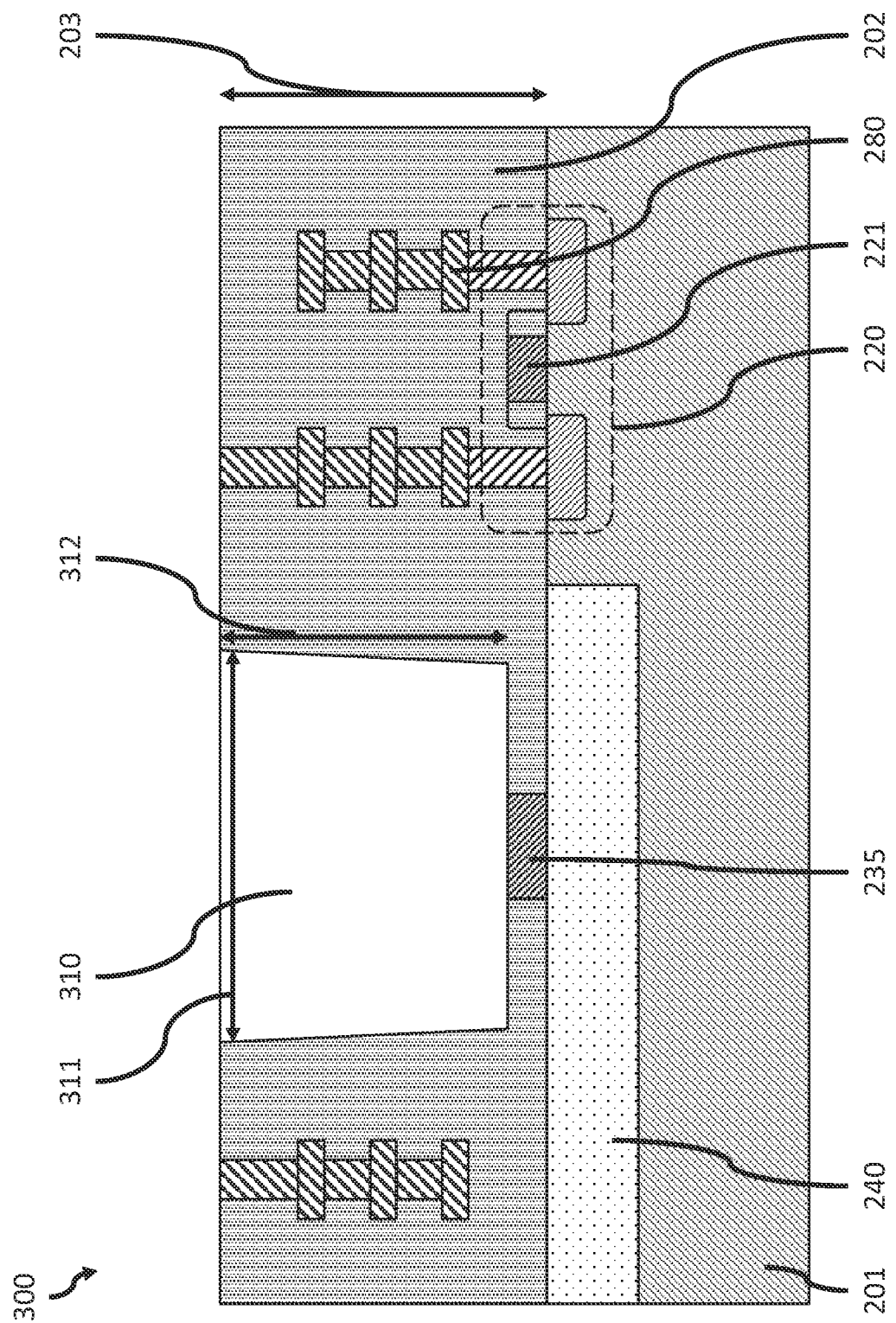
FIG. 3 shows the further processed wafer of FIG. 2.

FIG. 3 shows the wafer 300 after a trench 310 has been etched in the semi-finished wafer 200, in particular, in the dielectric 202 of the semi-finished wafer 200.

The trench 310 may have a width 311 much larger than 10 µm. In particular, the width 311 of the trench 310 may be larger than 50 µm, more particularly, greater than 100 µm. Given the typical height 203 of the layers of the semi-finished wafer above the substrate, this width 311 may be sufficient to allow for process-safe etching the trench 310 up to the vicinity of the substrate 201 in the insulation area 240. In particular, the trench 310 may be etched deeper than the first metallization layer 280. The trench may have a depth 312 of more than 0.5 µm.

The trench 310 may be etched deep enough to expose the heater 235. Exposing the heater 235 may refer to removing material such that at least a part of the surface of the heater 235 is not covered with the dielectric 202. In the example shown in FIG. 3, the top surface of the heater 235 is exposed. However, it is also possible to expose (at least partially) the side surfaces of the heater 235.

Figure 4:
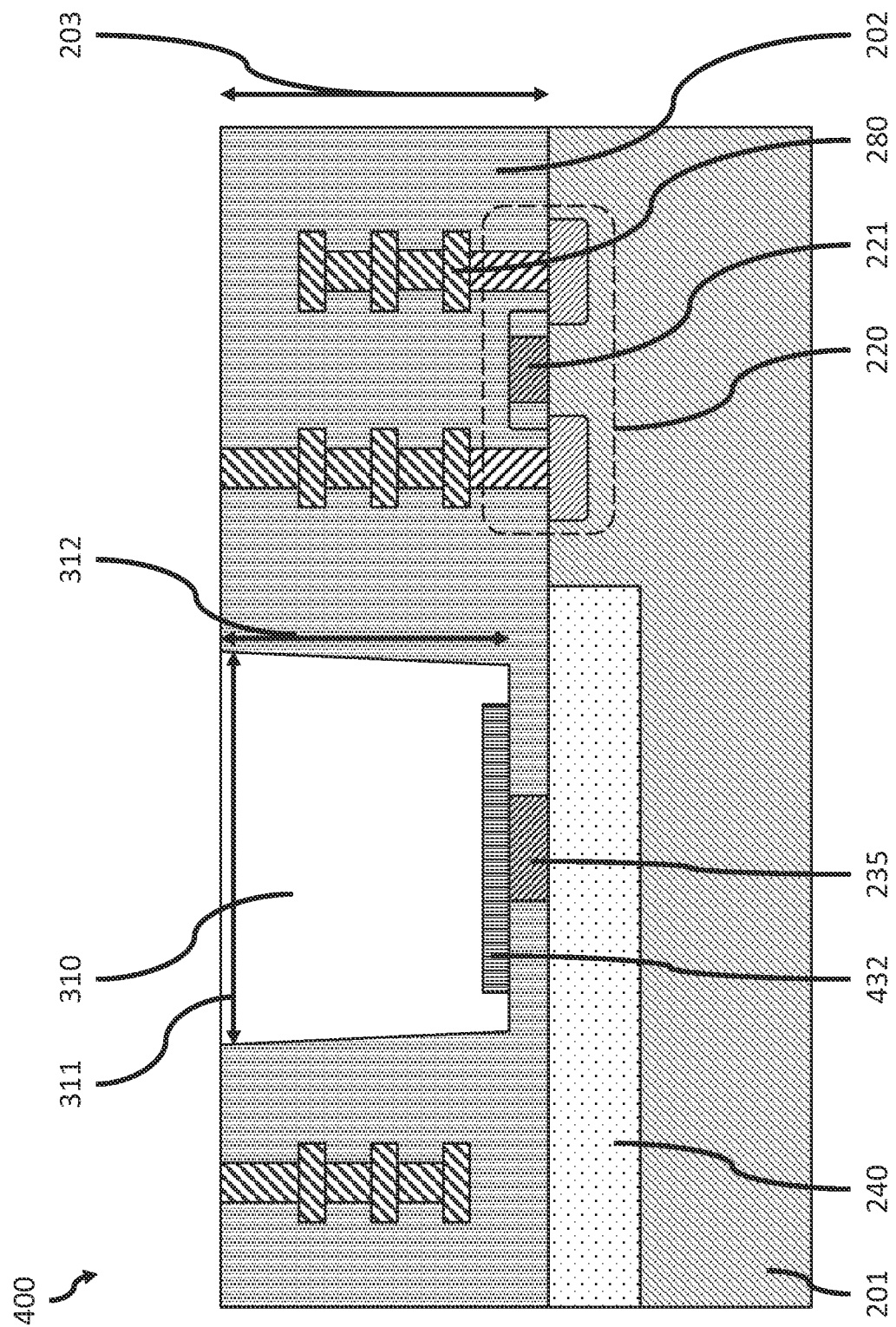
FIG. 4 shows the further processed wafer of FIG. 3.

FIG. 4 shows the wafer 400 after a barrier material has been deposited on the bottom surface of the trench 310. The barrier material layer 432 covers the exposed surface of the heater 235. In the example of FIG. 4, the barrier material layer 432 does not cover the whole bottom surface of the trench 310, but has been patterned. Patterning may comprise dry etching, in particular, anisotropic dry etching. Alternatively, patterning may comprise wet etching. Further embodiments may prescribe covering the whole bottom surface of the trench 310 with a barrier material layer. The barrier material may comprise a dielectric having a good thermal conductivity. In particular, the barrier material may include at least one of SiN (silicon nitride) and AlN (aluminum nitride). The barrier material layer may have a thickness above 30 nm. The barrier material layer may have a thickness below 100 nm, in particular below 70 nm. Such a thickness may be sufficient to electrically insulate the heater 235 from a phase change material layer (see below) provided above the barrier material layer 432 while establishing a good thermal contact with the phase change material layer.

Figure 5:
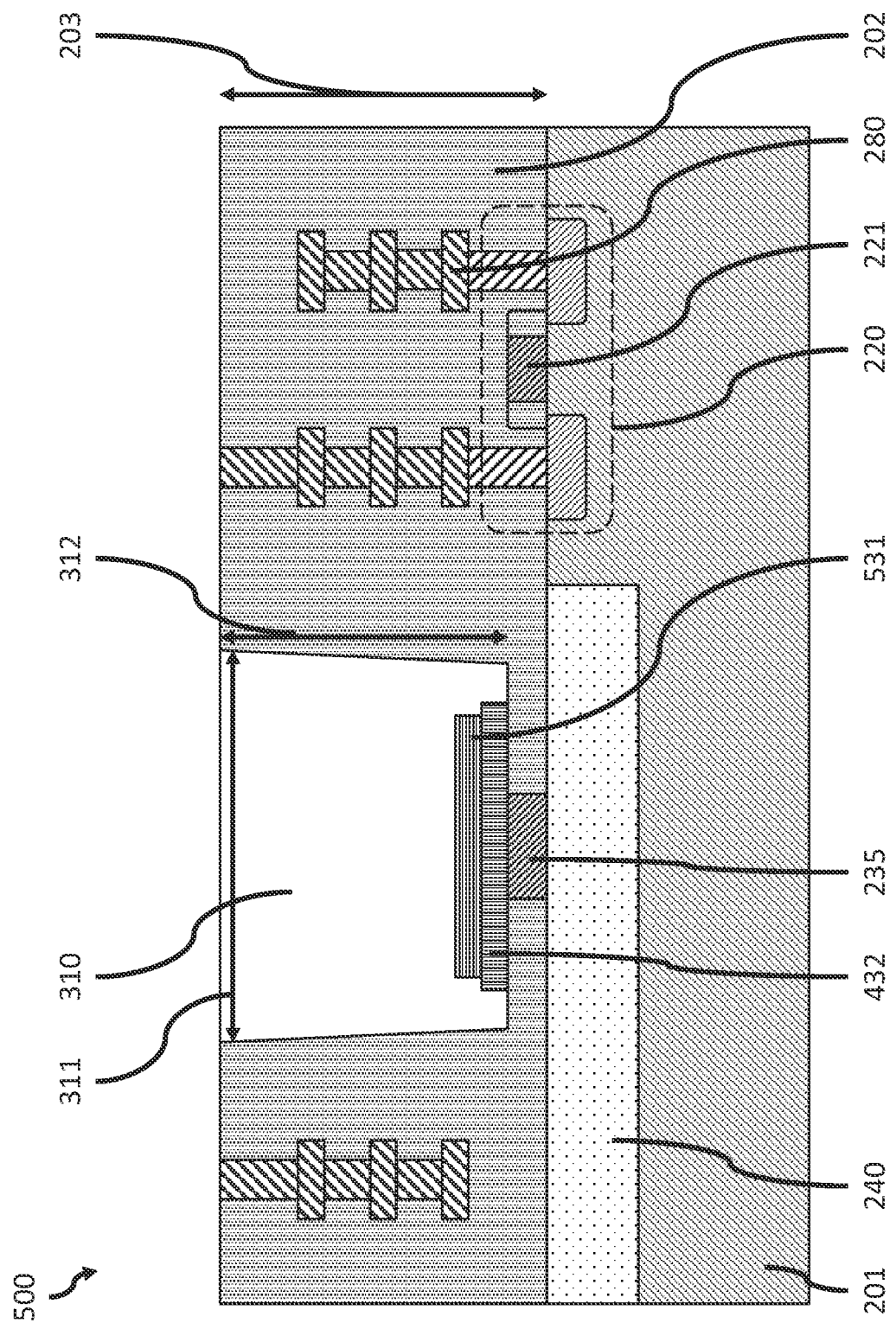
FIG. 5 shows the further processed wafer of FIG. 4.

According to FIG. 5, the phase change material is deposited after the barrier material to form a phase change material layer 531. The deposited phase change material may be patterned to form the phase change material layer 531. Theretofore, dry etching, in particular anisotropic dry etching, or wet etching may be used. As shown in the example of wafer 500, the barrier material layer 432 and the phase change material layer 531 have been patterned independently. However, it may also be possible to pattern those layers together using a single mask. The barrier material layer 432 forms a barrier between the heater 235 and the phase change material layer 531. The barrier material layer 432 may, in particular, electrically insulate the phase change material layer 531 from the heater 235. At the same time, the barrier material layer 432 may allow for a well-defined heat transfer from the heater 235 to the phase change material layer 531.

Figure 6:
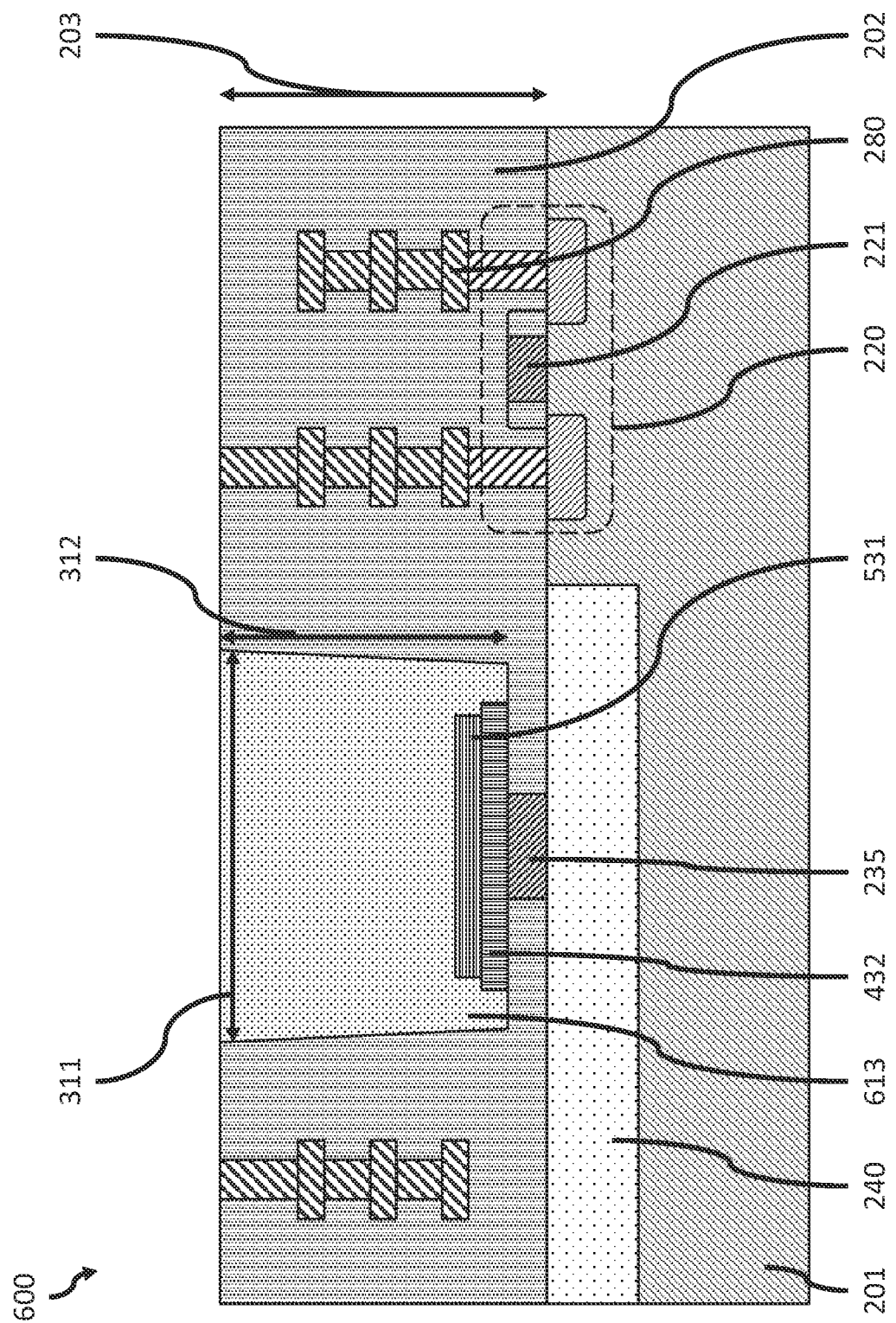
FIG. 6 shows the further processed wafer of FIG. 5.

The trench 310 may be filled with a trench filling dielectric 613 to obtain the wafer 600 as shown in FIG. 6. The surface of the wafer 600 has been planarized after filling the trench 310 with the trench filling dielectric 613.

Figure 7:
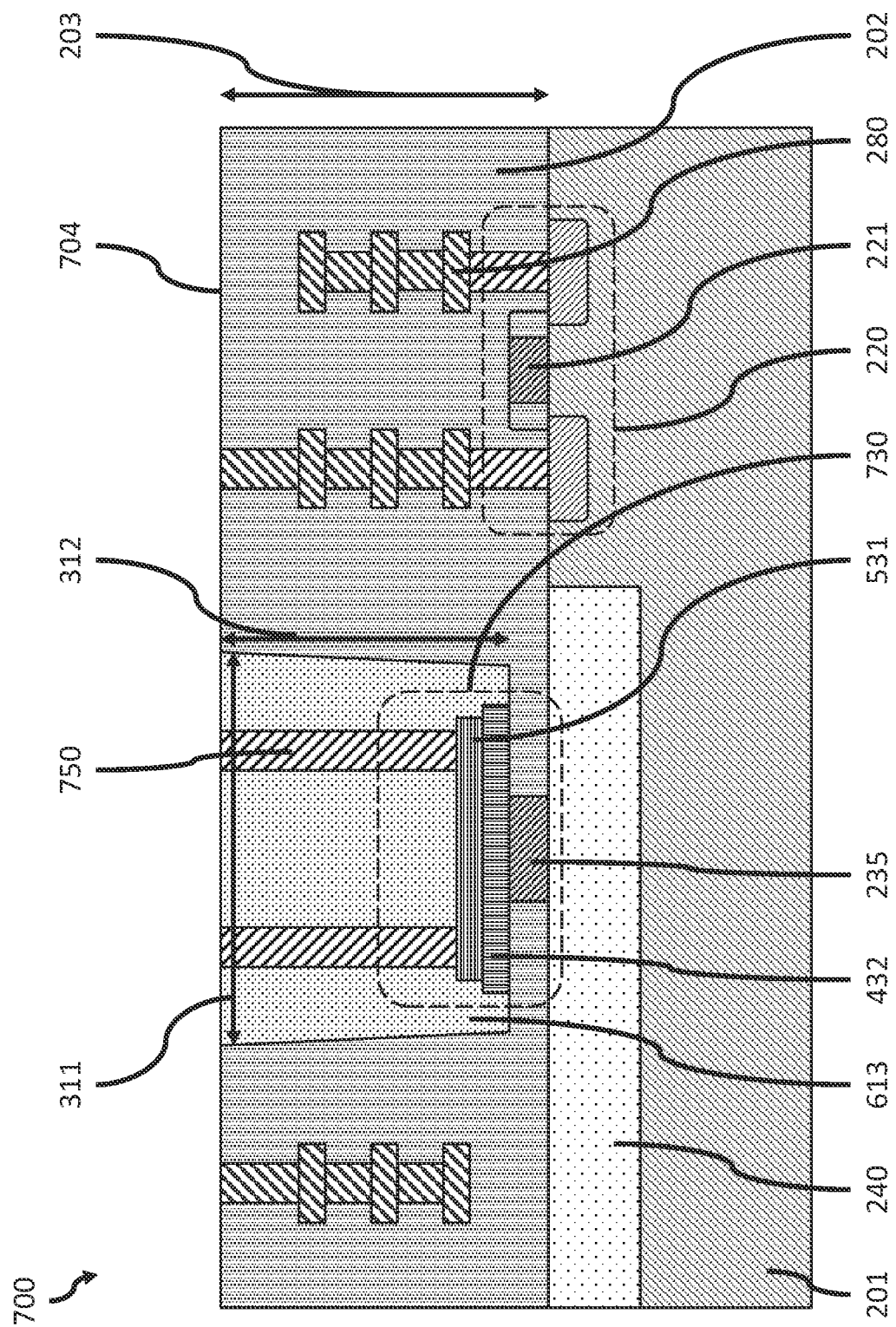
FIG. 7 shows the further processed wafer of FIG. 6.

FIG. 7 shows the wafer 700 after VIAs 750 have been formed through the trench filling dielectric 613 providing electrical access to the phase change material layer 531 from a top surface 704 of the planarized wafer 700. In addition or alternatively, VIAs may be provided providing electrical access to the heater 235 from a top surface 704 of the planarized wafer 700. The heater 235, the barrier material layer 432 and the phase change material layer 531 may form a phase change switch 730. In particular, heat generated by the heater 235 may be used to raise the temperature of the phase change material layer 531. The substrate 201 may be used as a heat sink for rapidly cooling and/or quenching the phase change material layer 531. Hence, the phase change switch 730 may be controlled by passing a current through the heater 235.

Increasing the depth 312 of the trench 310 increases the thermal conductivity between the phase change material layer 531 and heater 235 on the one hand and the substrate 201 of the other hand. Thus, rapid cooling of the phase change material layer 531 for resetting the phase change switch 730 may be achieved. However, increasing said thermal conductivity also implies that a larger percentage of the heat generated by the heater 235 is dissipated through the substrate 201 instead of raising the temperature of the phase change material layer 531. Moreover, if the phase change switch 730 is provided to close to the substrate 201, the substrate 201 may negatively influence the radio frequency properties of the phase change switch 730.

Figure 8:
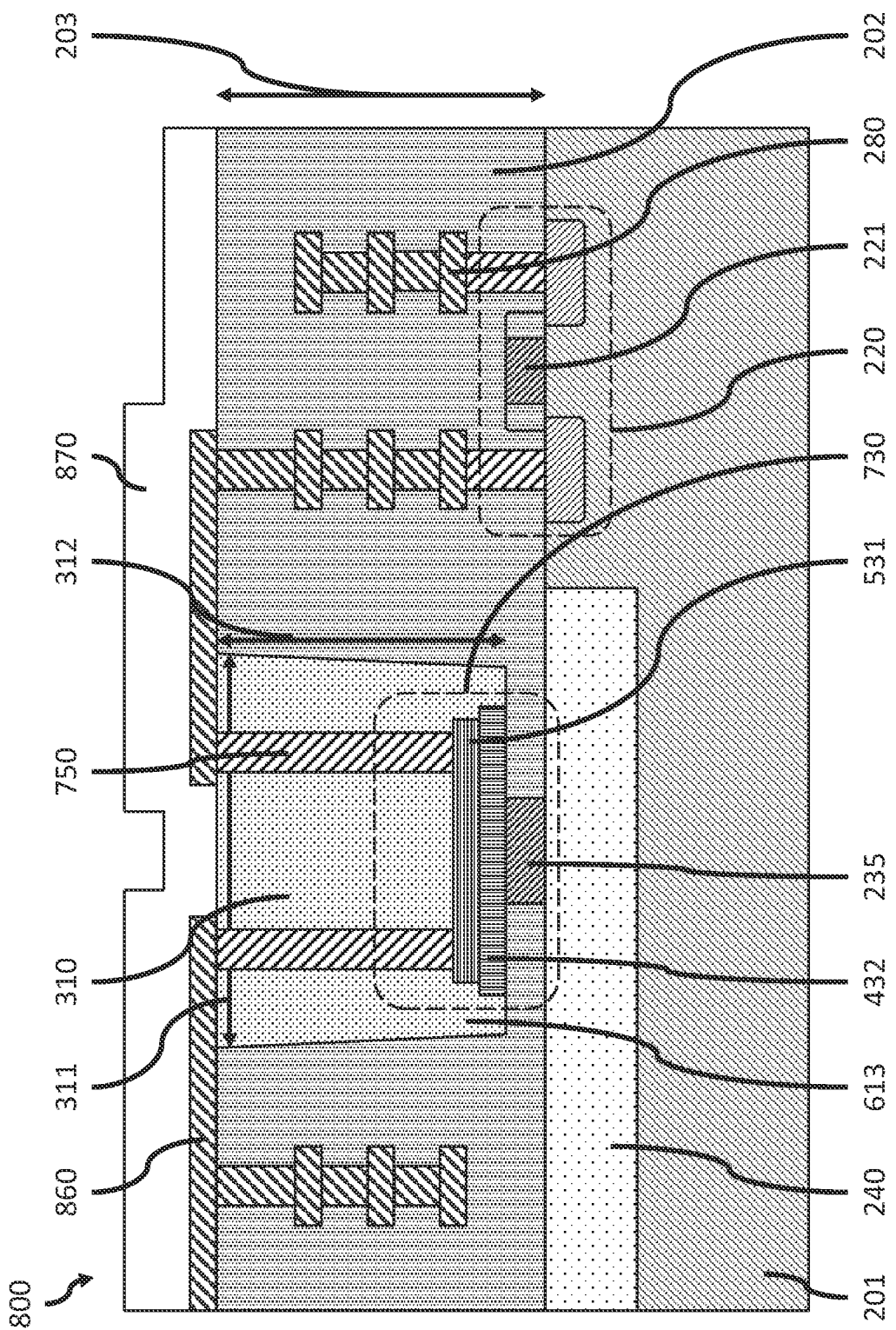
FIG. 8 shows a first integrated circuit.

As shown in FIG. 8, a redistribution layer 860 of wafer 800 may allow for electrically connecting the VIAs 750 to metal layers already present in the semi-finished wafer 200. In addition, a passivation layer 870 on the redistribution layer may be foreseen.

FIG. 8 discloses an integrated circuit 800 comprising a semiconductor device 220, a first metallization layer 280 above the semiconductor device 220 and a phase change switch 730. The first metallization layer 280 may electrically connect the semiconductor device 220 to at least one further semiconductor device (not shown) of the integrated circuit 800. In the embodiment shown in FIG. 8, the semiconductor device 220 is a transistor, more specifically, a CMOS transistor. In an alternative embodiment the semiconductor device 220 could also be a bipolar transistor or a gallium nitride transistor or even completely different semiconductor device like a light emitting diode, for example.

The first metallization layer 280 is provided laterally adjacent to the phase change switch 730. The first metallization layer 280 comprises an opening laterally surrounding the phase change switch 730. Seen from a direction perpendicular to the substrate 201 of the integrated circuit 800 and from a side opposite to the substrate 201, no part of the first metallization layer 280 covers any part of the phase change switch 730. At least a part of the phase change switch 730 is provided below the first metallization layer 280. In the example shown in FIG. 8, the heater 235 of the phase change switch 730 is provided below the first metallization layer 280. A phase change material layer 531 may also be provided below the first metallization layer 280. It is also possible that only a phase change material layer of a phase change switch is provided below the first metallization layer 280 and the heater of the phase change switch is provided at the same level as or above the first metallization layer 280.

The first metallization layer 280 may be the first metallization layer of a back-end off-line (BEOL). The BEOL follows the front-end off-line (FEOL). The front-end off-line may refer to the first portion of integrated circuit fabrication where the individual devices (transistors, capacitors, resistors, etc.) are patterned in the semiconductor. FEOL may cover everything up to (but not including) the deposition of metal interconnect layers.

For the CMOS process, FEOL may comprise all fabrication steps needed to form fully isolated CMOS elements: selecting the type of wafer to be used, chemical mechanical planarization and cleaning of the wafer, shallow trench isolation, well formation, gate module formation as well as source and drain module formulation.

Back-end off-line (BEOL) is the second portion of integrated circuit fabrication where the individual devices (transistors, capacitors, resistors, etc.) get interconnected with wiring on the wafer, the metallization layer. The first metallization layer referred to hereinbefore may be a metallization layer of a back-end off-line. The first metallization layer may be formed from copper (Cu) or aluminum (Al). BEOL may begin when the first layer of metal is deposited on the wafer. BEOL may include contacts, insulating layers (dielectrics), metal levels, and bonding sites for chip to package connections.

After the last FEOL step, there may be a wafer with isolated transistors (without any wires). In the BEOL part of fabrication stage contacts (pads), interconnect wires, VIAs and dielectric structures may be formed. For modern integrated circuit processes, more than 10 (ten) metal layers may be added in the BEOL. Steps of the BEOL may include silicidation of source and drain regions as well as polysilicon regions, adding a dielectric, which may be called pre-metal dielectric (PMD), to isolate metal from silicon and polysilicon, chemical mechanical polishing (CMP) processing the dielectric, making holes in the PMD, making contacts in the holes of the PMD, adding a metal layer, adding a second dielectric, which may be called inter-metal dielectric (IMD), making VIAs through the IMD to connect lower metal layers with higher metal layers and filling the VIAs using a metal chemical vapor deposition (CVD) process, and—after repeated formation of metallization layers—adding a final passivation layer to protect the integrated circuit.

After BEOL there may be a "back-end process", which may be performed outside of a cleanroom and often by a different company.

Providing at least the part of the phase change switch 730 below the first metallization layer 280 may result in a position of the phase change switch 730 being close to the substrate 201. This may help to ensure a rapid quenching of the phase change material after heating.

As explained hereinbefore, the phase change switch 730 comprises a heater 235. However, it may also be possible to provide a phase change switch without a dedicated heater. In this case, the heat necessary for changing the phase of the phase change material layer may be provided by letting an exceptional high current flow through the phase change material layer. The transistor 220 may be part of control circuitry for operating the heater 235.

As explained hereinbefore, a part of the heater 235 and a part of the transistor 220 may be made of the same material. In the exemplary embodiment shown in FIG. 8, the heater 235 is made of the same material as the gate 221 of the transistor 220. However, the heater may also be made of the same material as a contact of the transistor 220. For example, the heater may be made of a silicide and a contact of the transistor 220 may be made of the same silicide. With respect to possible materials, reference is made to the explanations given above. Using the same material for a part of the heater 235 and a part of the transistor 220 may facilitate manufacturing of the integrated circuit 800. In particular, no new materials have to be introduced during manufacture of a semi-finished wafer. In particular, compliance of the material of the part of the heater 235 with the process for manufacturing the transistor 220 is automatically ensured.

The part of the heater 235 and the part of the transistor 220 may be provided in the same layer of the integrated circuit 800. Thus, no additional process steps for manufacturing the heater 235 may be required. It may be sufficient to simply adapt the mask for manufacturing a part of the transistor, for example, the mask for manufacturing the gate 221. Reducing the number of steps for manufacturing the integrated circuit 800 may considerably reduce the complexity and costs for manufacturing the integrated circuit.

Figure 9:
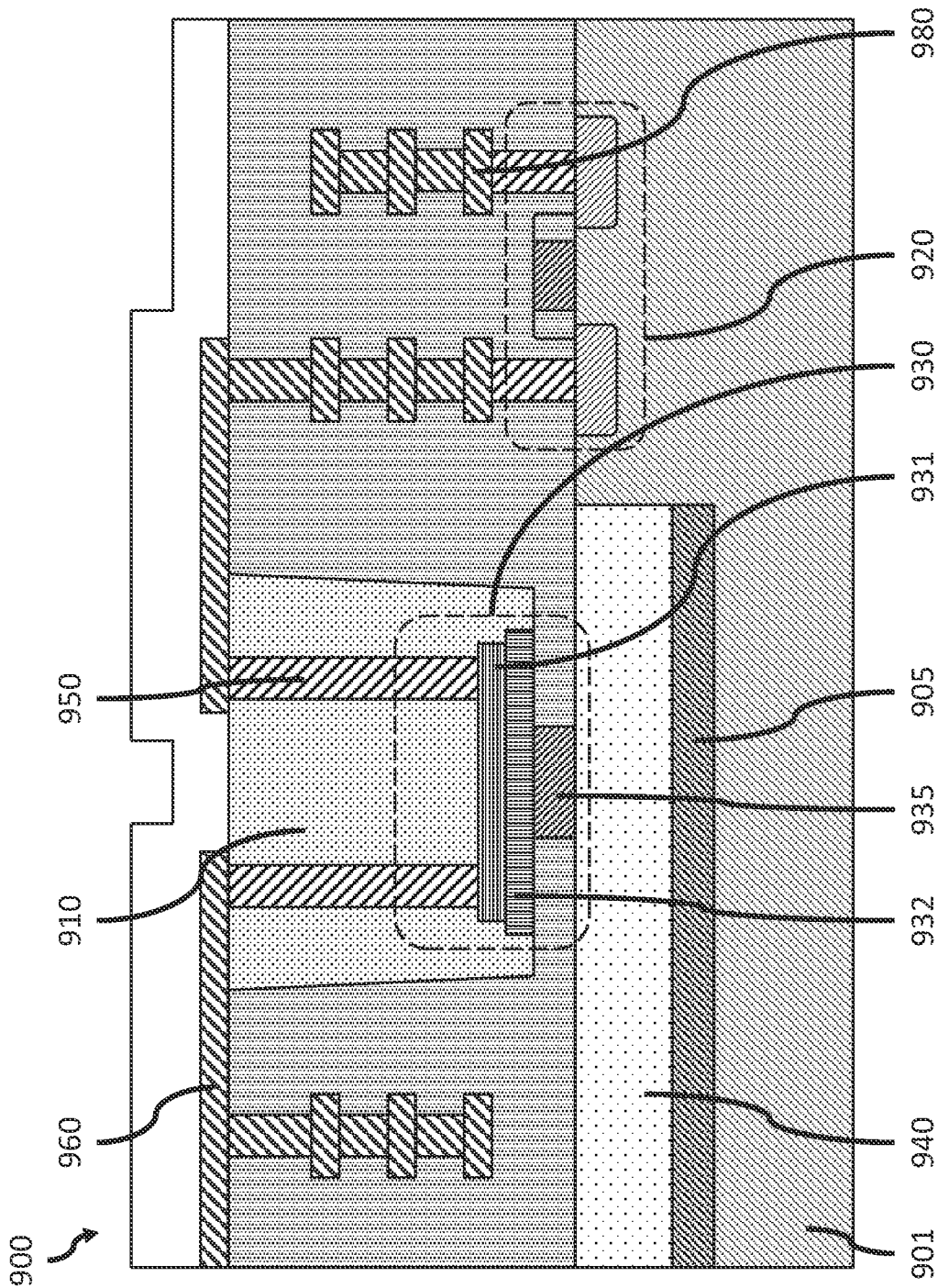
FIG. 9 shows a second integrated circuit.

FIG. 9 shows a further integrated circuit 900 comprising a transistor 920, a first metallization layer 980 above the transistor 920 and a phase change switch 930. The phase change switch 930 includes a heater 935, a barrier layer 932 and a phase change material layer 931. VIAs 950 and an interconnect layer 960 are provided to connect the phase change switch 930 to transistors of the integrated circuit 900.

The integrated circuit 900 differs from the integrated circuit 800 in that a free charge carrier reduction layer 905 is provided. The free charge carrier reduction layer 905 is provided below an insulation area 940 formed in the substrate 901. Like the integrated circuit 800 may be manufactured starting from a semi-finished wafer 200, the integrated circuit 900 may be manufactured starting from a semi-finished wafer. Said semi-finished wafer may already comprise the free charge carrier reduction layer 905. Free charge carriers may interact with signals transmitted through the phase change switch 930. Reducing the amount of free charge carriers in the vicinity of the phase change switch 930 may improve the linearity of the phase change switch 930.

The free charge carrier reduction layer 905 may comprise a point defect rich layer. Alternatively or in addition, the free charge carrier reduction layer 905 may comprise a dislocation rich layer. In particular, the free charge carrier reduction layer 905 may comprise a layer damaged by ion implementation, for example, damaged by argon iron implementation.

The free charge carrier reduction layer 905 may also comprise a doped layer. In particular, the free charge carrier reduction layer 905 may comprise a boron and/or indium doped layer.

Figure 10:
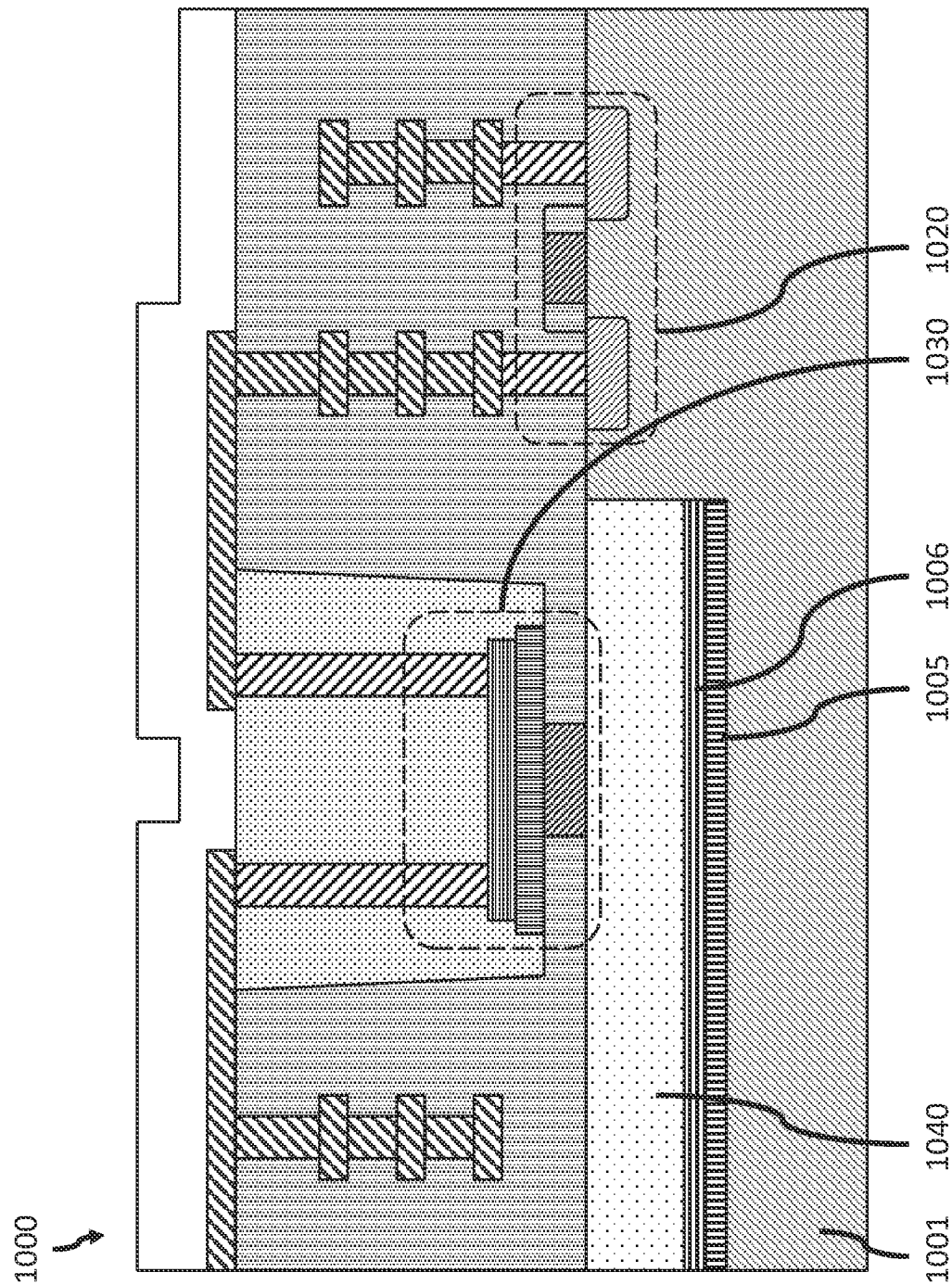
FIG. 10 shows a third integrated circuit.

FIG. 10 shows a still further embodiment of an integrated circuit 1000 comprising a phase change switch 1030 and a transistor 1020 similar to the integrated circuits 800 and 900.

Below an insulation area 1040 in the substrate 1001 strained and stressed layers 1005 and 1006 are provided. Said strained and stressed layers 1005 and 1006 may confine free charge carriers at the interface between the layers.

Similar to the free charge carrier reduction layer 905 disclosed with respect to FIG. 9, confining the free charge carriers may reduce the amount of free charge carriers in the vicinity of the phase change switch 1030. This may lead to an improved linearity of the phase change switch 1030.

Figure 11:
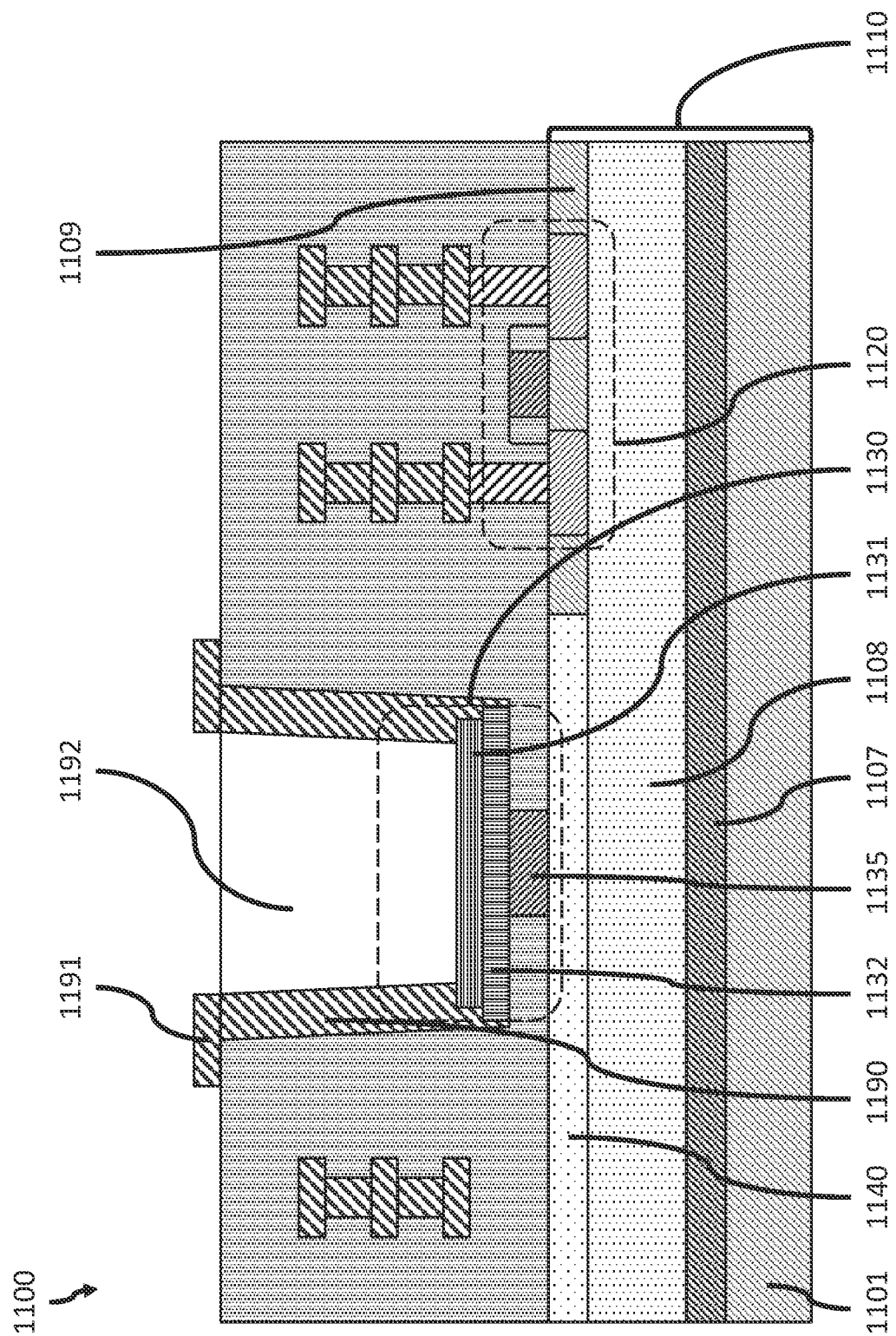
FIG. 11 shows a fourth integrated circuit.

FIG. 11 shows an integrated circuit 1100 including a phase change switch 1130 and a transistor 1120 similar to the integrated circuits 800, 900, 1000 shown in FIGS. 8 to 10.

In contrast to the integrated circuits described hereinbefore, the integrated circuit 1100 may have been formed from a silicon on insulator (SOI) substrate 1110. The SOI substrate may comprise a thin silicon layer 1109 above an SOI dielectric 1108 above a carrier wafer 1101. At the interface between the SOI dielectric 1108 and the carrier wafer 1101, a polysilicon layer 1107 is provided which may serve as a free charge carrier reduction layer. In an alternative embodiment using an SOI substrate, the free charge carrier reduction layer may also be omitted.

The phase change switch 1130 is provided above an insulation area 1140 formed in the thin silicon layer 1109 of the SOI substrate 1110. The integrated circuit 1100 shows a way to contact the phase change material layer 1131 of the phase change switch 1130 which differs from the method shown hereinbefore. Instead of providing VIAs for contacting the phase change material layer 1131, side wall metallization leading to side wall metallization 1190 of the trench 1192 is performed. Contacts 1191 may allow for electrically connecting the phase change material layer 1131 to further devices in a back-end process. In particular, filling the trench 1192 with a trench-filling dielectric may be omitted. Depending on the requirements the disclosed integrated circuits may comprise a side wall metallization for contacting the phase change switch or VIAs for contacting the phase change switch. The disclosed integrated circuits may also comprise both side wall metallization and VIAs for contacting the phase change switch. For example, side wall metallization may be used for contacting the phase change material layer of the phase change switch and VIAs may be used for contacting the heater of the phase change switch.

Figure 12:
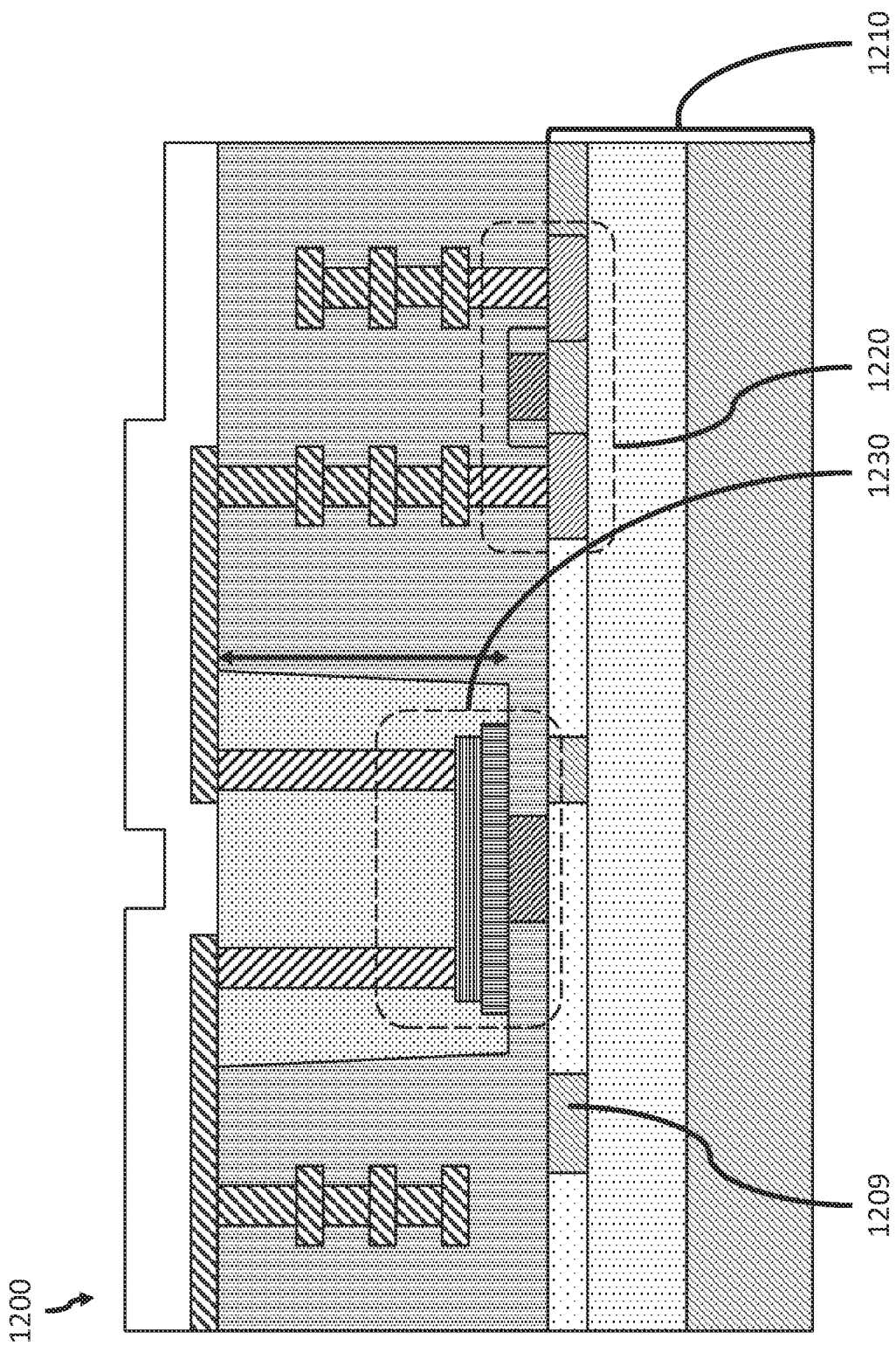
FIG. 12 shows a fifth integrated circuit.

FIG. 12 discloses a further integrated circuit 1200 which has been formed from an SOI substrate 1210. The integrated circuit 1200 comprises a phase change switch 1230 and transistor 1220. Moreover, SOI fillers 1209 are provided laterally and below the phase change switch 1230. The SOI fillers 1209 may be part of a free charge carrier reduction layer. In particular, said SOI fillers may trap free charge carriers.

Figure 13:
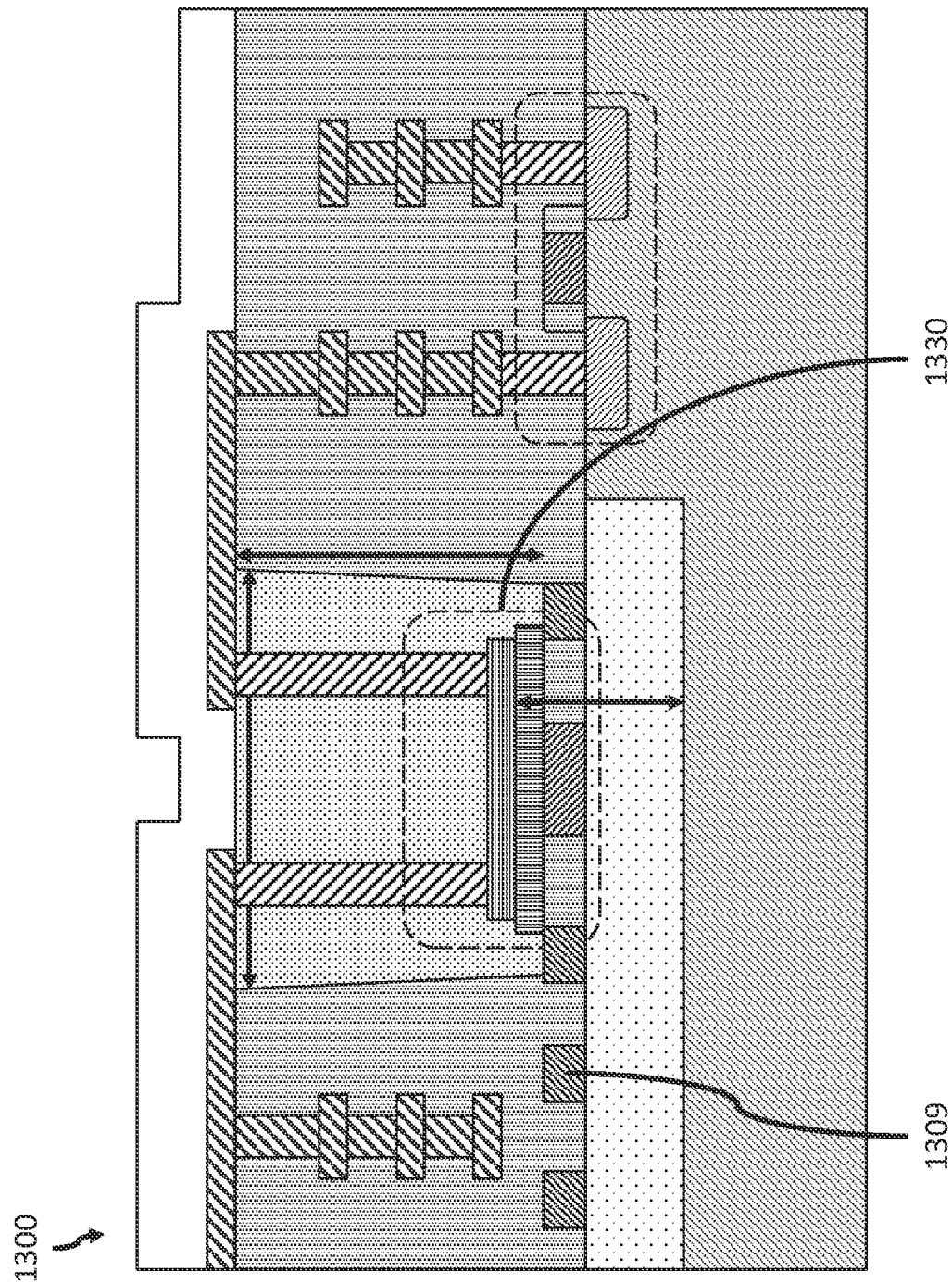
FIG. 13 shows a sixth integrated circuit.

Similarly, FIG. 13 discloses an integrated circuit 1300, wherein polysilicon fillers 1309 are provided laterally of and/or below a phase change switch 1330. Said polysilicon fillers 1309 may also serve to trap free charge carriers.

Figure 14:
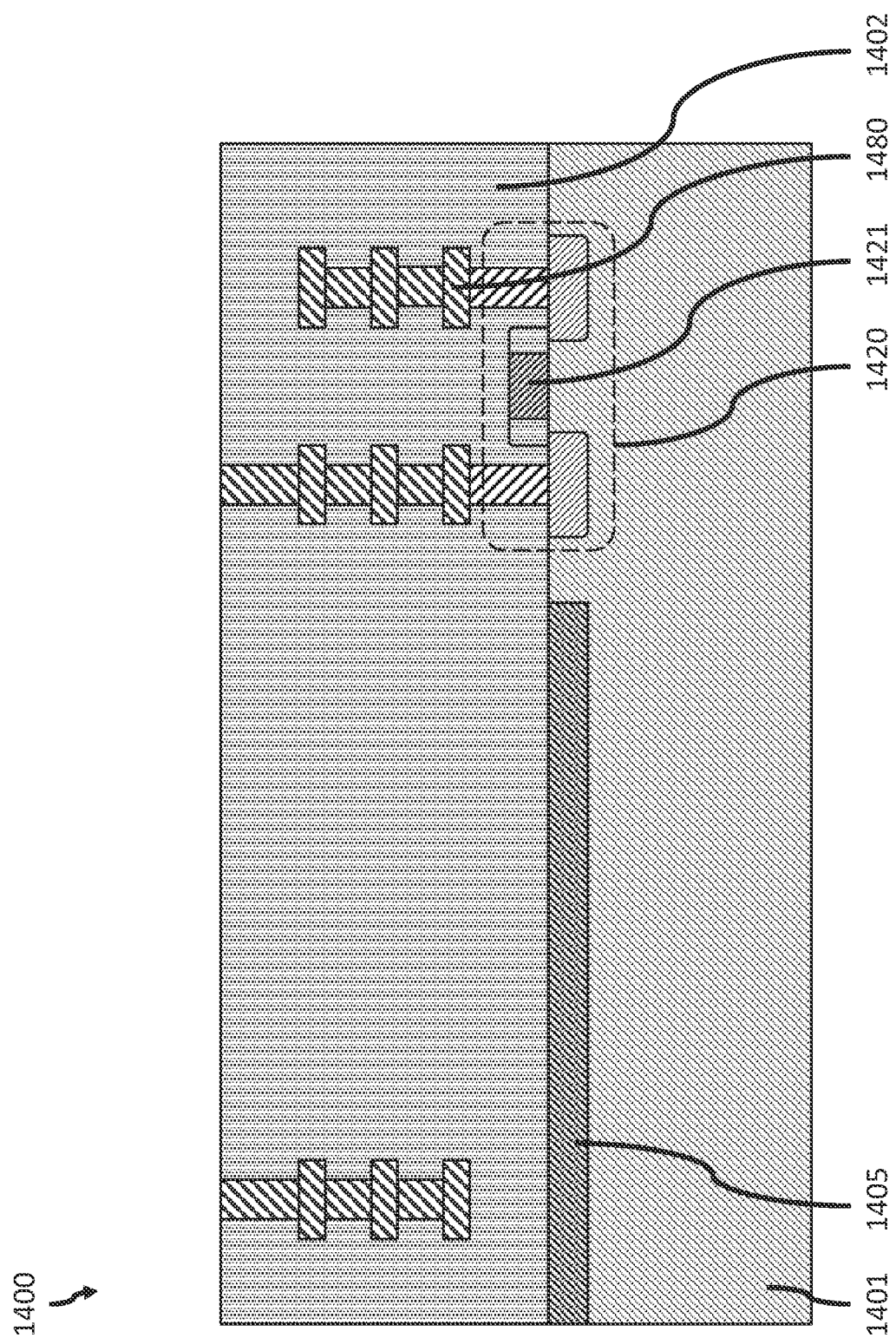
FIG. 14 shows a wafer for manufacturing an integrated circuit.

FIG. 14 shows a wafer 1400. The wafer 1400 may be a semi-finished wafer. The semi-finished wafer 1400 comprises a substrate 1401, a free charge carrier reduction layer 1405, a transistor 1420 comprising a gate 1421, a first metallization layer 1480 and a dielectric 1402 covering the transistor 1420. In contrast to the semi-finished wafer 200, the semi-finished wafer 1400 does not comprise a heater.

Figure 15:
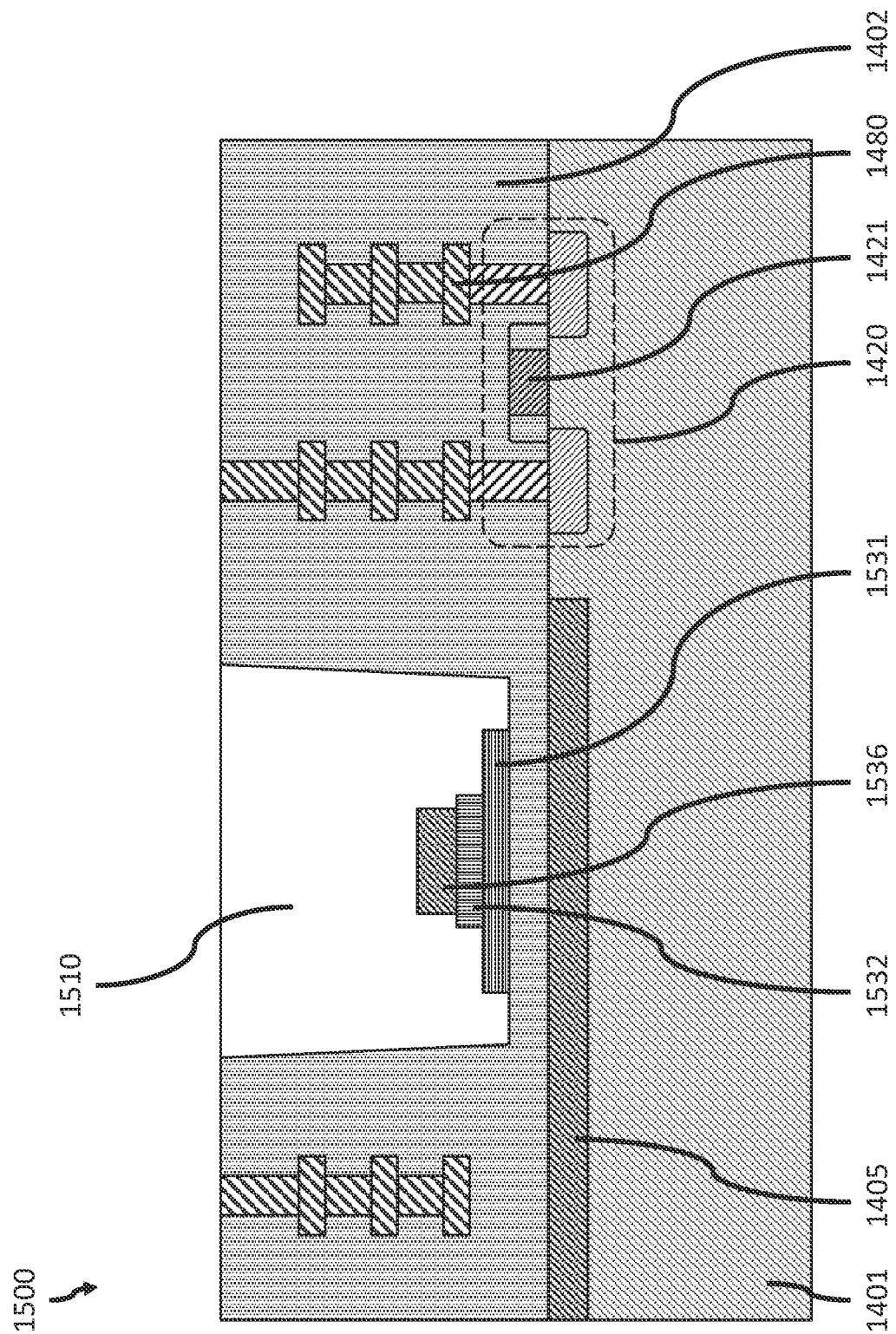
FIG. 15 shows the further processed wafer of FIG. 14.

As shown in FIG. 15, the semi-finished wafer 1400 may be processed to obtain a wafer 1500. The wafer 1500 comprises a trench 1510 above the free charge carrier reduction layer 1405. Within the trench 1510 phase change material may be deposited to obtain a phase change material layer 1531. A barrier layer 1532 may be provided above the phase change material layer 1531, and a heater 1536 may be provided above a barrier layer 1532.

Figure 16:
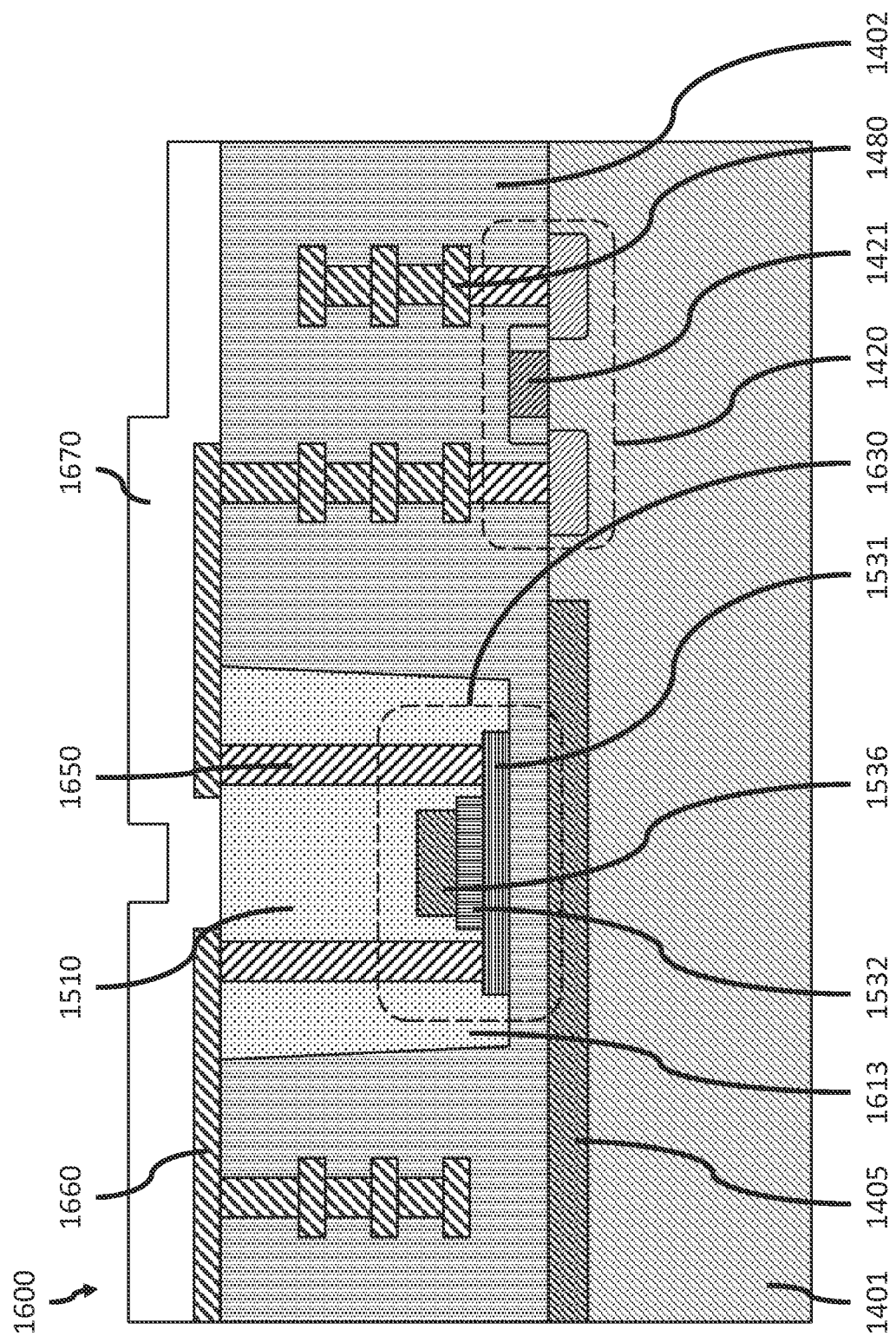
FIG. 16 shows a seventh integrated circuit.

As shown in FIG. 16, an integrated circuit 1600 may be obtained from the wafer 1500, by filling the trench with a trench filling dielectric 1613, providing VIAs 1650 for contacting the phase change material layer 1531 and providing a passivation layer 1670 covering the wafer. According to the exemplary integrated circuit of FIG. 16, the heater is provided above the phase change material layer 1531 and not below as shown in FIG. 8, for example. This may reduce the time for quenching the phase change material layer.

Figure 17:
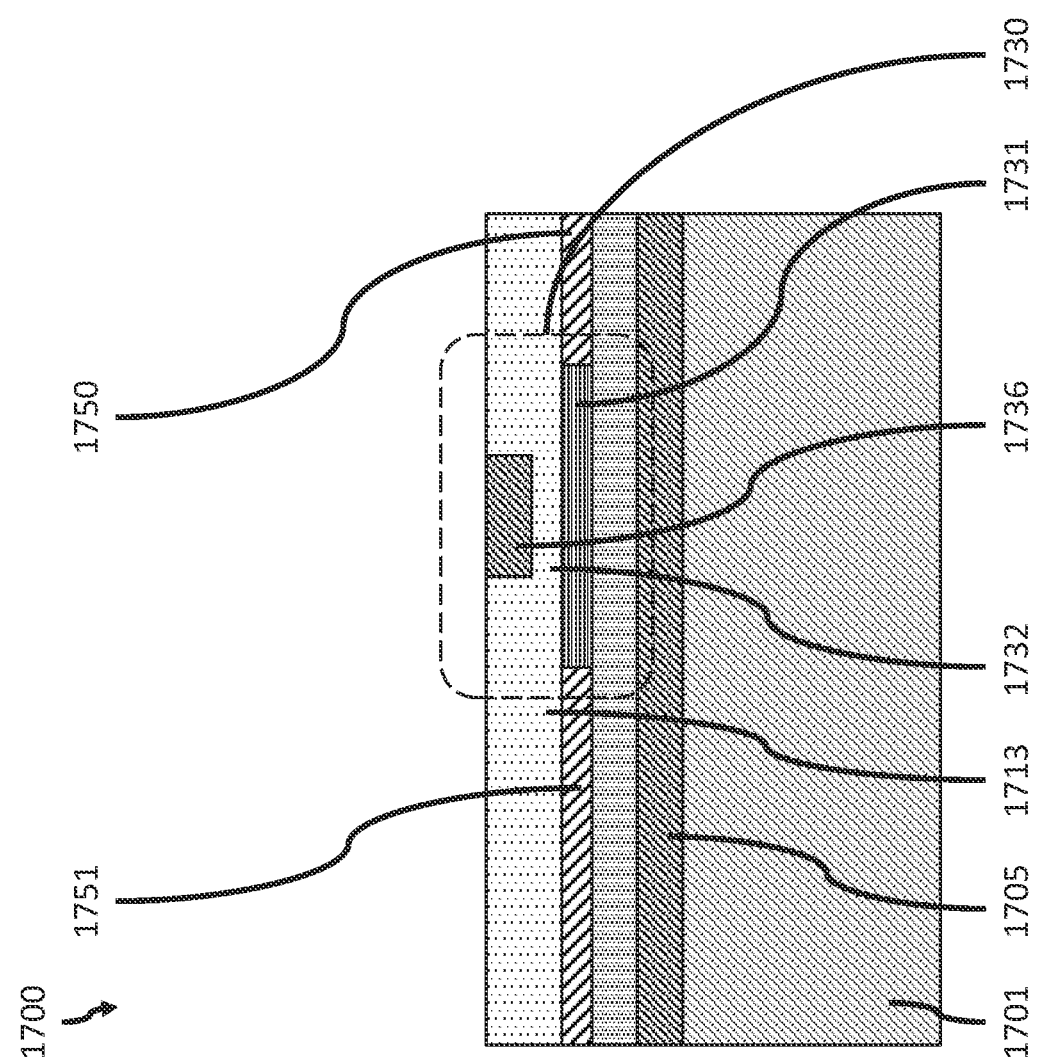
FIG. 17 shows an eighth integrated circuit.

FIG. 17 shows an integrated circuit 1700 which is quite similar to the integrated circuit 1600 with respect to the phase change switch 1730. However, the integrated circuit 1700 only comprises the phase change switch 1730 and no additional transistor. The integrated circuit 1700 comprises a substrate 1701, the free charge carrier reduction layer 1705 and the phase change switch 1730 above the free charge carrier reduction layer 1705. In the example of FIG. 17, a continuous free charge carrier reduction layer 1705 is provided below the phase change switch 1730. However, as shown in FIGS. 12 and 13, for example, the free charge carrier reduction layer may also be formed of polysilicon and/or SOI fillers. Thus, the advantages described of the different techniques for forming a free charge carrier reduction layer may also be obtained for an integrated circuit only comprising a phase change switch and no additional transistor. In particular, the phase change switch may comprise the heater above and/or below a phase change material layer, wherein a barrier layer is provided between the phase change material layer and the heater.

Additionally, the following numbered examples demonstrate one or more aspects of the disclosure, wherein the technical features specified in the examples are followed by reference signs, placed in parentheses, to increase the intelligibility of the examples. These reference signs shall not be construed as limiting the examples to the embodiments shown in the drawings.

Example 1

An integrated circuit (800) comprising a transistor (220), a first metallization layer (280) above the transistor (220) electrically connected to the transistor (220), a phase change switch (730), in particular a phase change RF-switch (730), wherein at least a part of the phase change switch (730) is provided below the first metallization layer (280), and wherein the first metallization layer (280) is provided laterally adjacent to the phase change switch (730) and/or comprises an opening laterally surrounding the phase change switch (730).

Example 2

The integrated circuit (800) according to example 1, wherein the first metallization layer (280) above the transistor (220) electrically connects the transistor (220) to at least a further semiconductor device of the integrated circuit.

Example 3

The integrated circuit (800) according to example 1 or 2, wherein the transistor (220) is a CMOS, bipolar or GaN transistor.

Example 4

The integrated circuit (800) according to any one of examples 1 to 3, wherein the phase change switch (730) comprises a heater (235).

Example 5

The integrated circuit (800) according to example 4, wherein the heater (235) is provided below the first metallization layer (280).

Example 6

The integrated circuit (800) according to any one of examples 1 to 5, wherein the transistor (220) is part of control circuitry for operating the heater (235).

Example 7

The integrated circuit (800) according to any one of the examples 1 to 6, wherein a part of the heater (235) and a part (221) of the transistor (220) are made of the same material.

Example 8

The integrated circuit (800) according to example 7, wherein the part of the heater (235) and the part (221) of the transistor (220) are provided in a same layer of the integrated circuit (800).

Example 9

The integrated circuit (800) according to example 7 or 8, wherein the material of the part of the heater (235) comprises at least one of polysilicon, tungsten, a conductive silicide, in particular, tungsten silicide, cobalt silicide, titanium silicide, a conductive nitride, in particular, titanium nitride, tantalum nitride.

Example 10

The integrated circuit (800) according to any one of the examples 1 to 9, wherein the integrated circuit (800) comprises a redistribution layer (860) above the phase change switch (730) and the transistor (220), and VIAs (750) electrically connecting the phase change material layer (531) and/or the first metallization layer (280) above the transistor (220) and/or the heater (235) to the redistribution layer (860).

Example 11

A method for manufacturing an integrated circuit (800), in particular for manufacturing an integrated circuit (800) according to any one of examples 1 to 10, wherein the integrated circuit (800) comprises a phase change switch (730) comprising a phase change material, a transistor (220), in particular a CMOS, bipolar or GaN transistor, and a first metallization layer (280) above the transistor (220), wherein the method comprises providing a wafer (200), wherein the wafer (200) comprises the transistor (220) and the first metallization layer (280); etching a trench (310) in the wafer (200), wherein the trench (310) is etched deeper than the first metallization layer (280); and depositing the phase change material in the trench to form a phase change material layer (531).

Example 12

The method according to claim 11, wherein the first metallization layer (280) above the transistor electrically connects the transistor (220) to at least a further semiconductor device of the wafer (200).

Example 13

The method according to example 11 or 12, wherein the method further comprises filling the trench (310) with a trench-filling dielectric (613).

Example 14

The method according to any one of examples 11 to 13, wherein the trench (310) is etched in an insulation area, in particular in a shallow trench insulation, STI, area (240) of the wafer (200).

Example 15

The method according to any one of examples 11 to 14, wherein the trench (310) has a width (311) greater than 10 µm, in particular greater than 50 µm, more particularly greater than 100 µm.

Example 16

The method according to any one of examples 11 to 15, wherein the trench (310) has a depth (312) of more than 0.5 µm.

Example 17

The method according to any one of examples 11 to 16, wherein the phase change material comprises germanium telluride, GeTe.

Example 18

The method according to any one of examples 11 to 17, wherein the method further comprises patterning the phase change material layer (531).

Example 19

The method according to claim 18, wherein patterning the phase change material layer (531) comprises wet-etching and/or dry-etching, in particular anisotropic dry-etching.

Example 20

A wafer (200), in particular a wafer (200) for manufacturing an integrated circuit (800) using a method according to any one of the preceding examples 11 to 19, wherein the wafer (200) comprises a transistor (220), a first metallization layer (280) above the transistor (220), and a heater (235).

Example 21

The wafer (200) according to example 20, wherein the heater (235) is provided below the first metallization layer (280).

Example 22

The wafer (200) according to example 20 or 21, wherein the transistor (220) is part of control circuitry for operating the heater.

Example 23

The wafer (200) according to any one of examples 20 to 22, wherein a part of the heater (235) and a part (221) of the transistor (220) are made of the same material.

Example 24

The wafer (200) according to any one of the examples 20 to 23, wherein the material of the part of the heater (235) comprises at least one of polysilicon, tungsten, a conductive silicide, in particular, tungsten silicide, cobalt silicide, titanium silicide, a conductive nitride, in particular, titanium nitride, tantalum nitride.

Example 25

The method according to any one of the examples 11 to 19, wherein providing a wafer (200) comprises providing a wafer (200) according to any one of claims 20 to 24, and wherein etching a trench (310) in the wafer (200) comprises exposing the heater (235).

Example 26

The method according to any one of the examples 11 to 19 or 25, wherein the method further comprises depositing a heater material to form a heater material layer (1036).

Example 27

The method according to any one of the examples 11 to 19, 25 or 26, wherein the method further comprises depositing a barrier material to form a barrier material layer (432) before or after depositing the phase change material, wherein the barrier material layer (432) forms a barrier between the heater and/or the heater material layer (1036).

Example 28

The method according to example 27, wherein the method further comprises patterning the barrier material layer (432) before or after depositing the phase change material.

Example 29

The method according to example 28, wherein patterning the barrier material layer (432) comprises wet-etching and/or dry-etching, in particular anisotropic dry-etching.

Example 30

The method according to any one of examples 11 to 29, wherein the method further comprises depositing a heater material to form a heater material layer (1036).

Example 31

The method according to example 30, wherein the heater material is deposited to form a heater material layer above the barrier material layer (1032) provided above the phase change material layer (1031).

Example 32

The method according to example 30 or 31, wherein the method further comprises patterning the heater material layer (1036).

Example 33

The method according to any one of examples 11 to 32, wherein the method further comprises planarizing the wafer (600) after filling the trench (310) with the trench-filling dielectric (613); and forming VIAs (750) providing electrical access to the phase change material layer (531) and/or the first metallization layer above the transistor (220) and/or the heater from a top surface (704) of the planarized wafer (700).

Example 34

The method according to example 33, wherein the method further comprises providing a redistribution layer (860) connecting the VIAs (750) on the planarized wafer (700).

Example 35

The method according to example 34, wherein the method further comprises providing a passivation layer (870) on the redistribution layer (860).

Example 36

The method according to any one of examples 11 to 35, wherein the wafer comprises
a free charge carrier reduction layer (905; 1005, 1006; 1107; 1209; 1309; 1405).

Example 37

An integrated circuit (1700) comprising
a substrate (1701),
a free charge carrier reduction layer (1705) above the substrate (1701), and
a phase change switch (1730) above the free charge carrier reduction layer (1705).

Example 38

The method according to example 36 or integrated circuit according to example 37,
wherein the free charge carrier reduction layer comprises a point defect rich layer; and/or
wherein the free charge carrier reduction layer comprises a dislocation rich layer; and/or
wherein the free charge carrier reduction layer comprises a layer (905, 1305) damaged by ion implantation, in particular a layer (905, 1305) damaged by Argon ion implantation; and/or
wherein the free charge carrier reduction layer comprises a doped layer (905, 1305), in particular a Boron and/or Indium doped layer (905, 1305); and/or
wherein the free charge carrier reduction layer comprises polycrystalline layer (1107), in particular a polysilicon layer (1107); and/or
wherein the free charge carrier reduction layer comprises a strained and/or stressed layer (1005, 1006); and/or
wherein the free charge carrier reduction layer comprises an SOI filler (1209); and/or
wherein the free charge carrier reduction layer comprises a polysilicon filler (1309).

Example 39

The method according to any one of examples 11 to 19 or 25 to 36 or 38, wherein the wafer comprises a silicon-on-insulator substrate (1110, 1210).

Example 40

The method according to any one of examples 25 to 36, 38 or 39, wherein the method further comprises adjusting a resistivity of the material of the part of the heater (235) by doping.

Example 41

A method for manufacturing a wafer according to any one of examples 20 to 24, wherein the part of the heater (235) and the part of the transistor (220) are manufactured in a same process step.

Example 42

An integrated circuit (800) comprising a transistor (220) and a phase change device (730), wherein the integrated circuit (800) has been manufactured according to any of a method according to any one of examples 11 to 19 or 25 to 36 or 38 to 41.

What is claimed is:

1. An integrated circuit, comprising:
   a transistor;
   a first metallization layer above the transistor and electrically connected to the transistor; and
   a phase change switch,
   wherein at least a part of the phase change switch is provided below the first metallization layer,
   wherein the first metallization layer is provided laterally adjacent to the phase change switch,
   wherein the phase change switch comprises a heater, and
   wherein the heater and a part of the transistor are each provided in a lower-level interconnect layer of the integrated circuit.

2. The integrated circuit of claim 1, wherein the heater and a part of the transistor are each provided in a same layer of the integrated circuit.

3. The integrated circuit of claim 2, wherein the same layer of the integrated circuit is a polysilicon layer that is formed directly on a main surface of a semiconductor substrate.

4. The integrated circuit of claim 1, wherein the phase change switch is a phase change RF-switch.

5. The integrated circuit of claim 1, wherein the transistor is part of control circuitry for operating the heater.

6. A wafer, comprising:
   a transistor;
   a first metallization layer above the transistor; and
   a heater,
   wherein the transistor and the heater are each provided in a same layer of the integrated circuit.

7. The wafer of claim 6, wherein the transistor and the heater are each provided in a same layer of the integrated circuit.

8. The wafer of claim 7, wherein the same layer of the integrated circuit is a polysilicon layer that is formed directly on a main semiconductor surface of the wafer.

9. The integrated circuit of claim 6, wherein the heater is part of a phase change switch.

10. The wafer of claim 9, wherein the transistor is part of control circuitry for operating the heater.

* * * * *